United States Patent [19]

Chance et al.

[11] Patent Number: 5,087,951
[45] Date of Patent: Feb. 11, 1992

[54] SEMICONDUCTOR MEMORY DEVICE TRANSISTOR AND CELL STRUCTURE

[75] Inventors: Randal W. Chance; Tyler A. Lowrey, both of Boise, Id.

[73] Assignee: Micron Technology, Boise, Id.

[21] Appl. No.: 713,535

[22] Filed: Jun. 6, 1991

Related U.S. Application Data

[63] Continuation of Ser. No. 189,414, May 2, 1988, abandoned.

[51] Int. Cl.$^5$ ............... H01L 29/68; H01L 29/78; H01L 29/92
[52] U.S. Cl. ............................ 357/23.6; 357/68; 357/51
[58] Field of Search ............ 357/23.6, 59 G, 59 S, 357/59 K, 71, 65, 68, 51

[56] References Cited

U.S. PATENT DOCUMENTS

| | | | |
|---|---|---|---|
| 4,334,236 | 6/1982 | Hoffmann et al. | 357/23.6 |
| 4,392,210 | 7/1983 | Chan | 357/23.6 |
| 4,419,682 | 12/1983 | Masuoka | 357/23.6 |
| 4,513,304 | 4/1985 | Takemae | 357/23.6 |
| 4,545,037 | 10/1985 | Nakano et al. | 357/23.6 |
| 4,551,741 | 11/1985 | Shimotori et al. | 357/23.6 |
| 4,604,639 | 8/1986 | Kinoshita | 357/23.6 |
| 4,713,357 | 12/1987 | Imamura | 357/23.6 |
| 4,754,313 | 6/1988 | Takemae et al. | 357/23.6 |

FOREIGN PATENT DOCUMENTS

| | | | |
|---|---|---|---|
| 53-64483 | 6/1978 | Japan | 357/23.6 |
| 59-25265 | 2/1984 | Japan | 357/23.6 |
| 60-18954 | 1/1985 | Japan | 357/23.6 |
| 60-72261 | 4/1985 | Japan | 357/23.6 |
| 60-196967 | 10/1985 | Japan | 357/23.6 |
| 62-86754 | 4/1987 | Japan | 357/23.6 |

*Primary Examiner*—Andrew J. James
*Assistant Examiner*—Sara W. Crane
*Attorney, Agent, or Firm*—Stanley N. Protigal

[57] ABSTRACT

A dymanic random access memory device is constructed in which a first layer of semiconductive material is used to form series of transistors, using buried contacts on a silicon substrate. A dielectric is formed over the surface, and memory cells include a second layer of semiconductive material which is deposited over a dielectric. The active regions of the DRAM form a "dogbone" pattern, in which active regions exhibit elongate shapes in which each end of the elongate shape is wider than a center leg, and adjacent "dogbone" shapes are nested to form a compact pattern.

4 Claims, 9 Drawing Sheets

SEMICONDUCTOR MEMORY DEVICE TRANSISTOR AND CELL STRUCTURE

CROSS-REFERENCE TO RELATED APPLICATIONS

This is a continuation of U.S. application Ser. No. 7/184,414, filed May 2, 1988, now abandoned.

BACKGROUND OF THE INVENTION

This invention relates to the manufacture of semiconductor circuit devices. More specifically the invention relates to manufacture of multilayer semiconductor circuit devices in which photomasking steps are used in the manufacture.

The invention uses various materials which are electrically either conductive, insulative or semiconductor, although the completed semiconductor circuit device itself is usually referred to as a "semiconductor". One of the materials used is polysilicon material, referred to as "poly" throughout this disclosure.

The invention is used in a complete fabrication process for a cost-effective manufacturable means of high volume production of NMOS high density dynamic random access memories (DRAMs). It is called the reverse poly DRAM process. It requires only 7 photomasking steps total (including bond pad level) to produce high quality, high density NMOS DRAMs. This process is applicable to latest generation DRAM memory devices from 64 Kbit up through 1 Megbit density generations and beyond.

While the invention is described in terms of DRAMs, this is merely the preferred embodiment for which the inventive techniques were developed. The reverse poly DRAM process techniques are also applicable to related semiconductor circuit devices, including video random access memories (VRAMs) and other multiport RAMS, and other devices which use DRAM design techniques, such as optical sensing arrays. The reverse poly DRAM process techniques may be applicable to other types of semiconductor devices as well.

Producing DRAM IC memory circuits is a high volume business, in which process efficiency and manufacturability as well as product quality, reliability, and performance are essential key factors. This invention dramatically advances the "state of the art" in a number of ways in these areas.

The reverse poly DRAM process dramatically reduces the number of process steps, including masking steps, which has a direct impact on the cost, reliability, and manufacturability of the product. Latest generation DRAM products require scaling down to finer and finer geometries. This has a big impact on the cost of doing a photolithographic step. The source of this added cost comes from many sources. There are high capital costs associated with "state of the art" photolithographic equipment. Finer geometries require more complex photo processing in terms of more photo process steps per level and more equipment required, adding cost and using expensive ultra clean room floor space. Defect density is inevitably increased with each additional photomasking layer and compromises line yield, probe yield, and reliability. All photo layers require a subsequent step, either implant or etch. These are added steps adding to cost.

For the reverse poly DRAM process, no extra mask steps for Vt adjust is required. In DRAM applications the threshold voltage of the array access transistors have separate requirements from the peripheral transistors.

The access devices generally need a higher threshold than the periphery to optimize dynamic refresh characteristics. Peripheral transistors are optimized at reduced threshold values for maximum high speed performance.

The conventional solution to this is to separately adjust the threshold of these two groups of transistors using a photomasking level. The reverse poly DRAM process has been designed in terms of thermal cycles (Dt) and layout such that these two criteria are simultaneously met without a separate tailoring threshold adjust implant masking step required.

It is desired to improve yield and reliability and reduce manufacturing costs. This can be accomplished by reduced cycle times through fabrication, reduced total process inventory needed for a given run rate, more rapid response to process changes in volume quantities, more repeatable performance, and less number of steps to introduce variation. The process is shrinkable for subsequent generation products and the process flow fits in well with subsequent CMOS high density DRAM processes. The transistor structure is fully shrinkable while maintaining strong "long channel" characteristics, high performance, and minimal degradation with time (high reliability).

The process is compatible with today's IC fabrication equipment, not requiring exotic new equipment. It avoids problems with poly "stringers" or "sticks", a common problem with conventional DRAM process technology. The process reduces the number of high current implants from a conventional 2 to only 1 implant. This is a costly step in terms of both throughput and machine cost and is greatly advantageous to minimize. Self alignment of the cell capacitor dielectric region makes possible the use of a cell capacitor dielectric with reduced oxide thickness from the transistor gate oxide without having to define this with another masking level.

This same concept also makes it possible to use an alternative cell capacitor dielectric material with higher dielectric permittivity than conventional silicon dioxide. A higher permittivity dielectric results in increased cell capacitance per unit area. Higher cell capacitance improves immunity to single event upsets due to alpha particles or cosmic radiation. This results in higher operational reliability. It also reduces the amount of surface area needed for the cell capacitor, thus allowing for greater shrink and smaller die size. No extra photomasking step is required for this feature.

Poly 1 is used for the transistor poly and Poly 2 is used for the cell field plate poly. This is opposite of most other DRAM processes. As mentioned above, this approach offers advantages. The transistor poly photo patterning and etch critical dimension control is improved due to lack of concern for "Stringers" and extra topography.

"Stringer" problems are minimized since they are a factor only during Poly 2 etch.

Poly 2 etch for the reverse poly DRAM process is for patterning of the cell field plate which is a non-critical etch and can be done by a number of isotropic means. This insures complete etch removal of "Stringers". The extra topography seen at Poly 2 etch is less a factor due to the less stringent Cell plate poly etch tolerances required. Self-alignment is possible between the cell capacitor region and the access gate active channel region. There is less susceptibility to field oxide thinning between Poly 1 and Poly 2. The high current/high dose arsenic S/D implant is done prior to cell capacitor formation. This spares the cell cap of having to withstand the electric field stress present due to charging effects associated with the S/D implant. This is a major factor as cell dielectrics continue to thin and become more and more sensitive to E-fields present during processing. The reverse poly DRAM process also offers the following product performance advantages. The invention makes possible use of advanced transistor structures using LDD with flexibility for re-optimization when shrinking in the future. The transistor structure also minimizes high drain electric fields thus helping preserve device stability and long term reliability. The reverse poly DRAM process is highly compatible with subsequent generation (multi-megabit) CMOS DRAMs allowing multi-generation parts to run in the same Fabrication area. Flexibility in cell capacitor dielectric is made possible by having the option of independently varying the transistor gate oxide independent of the cell capacitor dielectric. This flexibility is made possible without adding a photomasking step.

SUMMARY OF THE INVENTION

Poly 1 is used for the transistor poly and Poly 2 is used for the cell field plate poly. This is opposite of most other DRAM processes. This approach offers several advantages:

(1) The transistor poly etch is always a critical etch step as its critical dimension has a strong influence on device parameters. It is done early in the reverse poly DRAM process where there is minimal topography. This provides the advantages of best control and repeatability of fine line patterning.

(2) It avoids problems associated with residual poly after poly etch known as "stringers" or "sticks". These are caused by re-entrant areas remaining after a conventional Poly 1 oxidation. Anisotropic etch of Poly 2 can leave residual poly in these areas, resulting in Poly 2-to-Poly 2 shorts. This places extra constraint on the transistor Poly 2 etch of a conventional flow where critical dimension control, stringer elimination, and extra topography must all be dealt with simultaneously. The reverse poly DRAM process avoids this problem by having transistor poly on the first poly.

(3) The second poly on the reverse poly DRAM process is for the cell plate and doesn't have the critical dimensional tight tolerance requirements that the transistor poly has. Thus it is possible to use isotropic processes for etch of the cell plate poly easily eliminating "stringer" problems. The extra topography present at Poly 2 is more easily tolerated with the less stringent cell plate poly etch tolerance requirements.

(4) The Poly 1 access device is fully encapsulated with oxide by the interpoly oxide on top of Poly 1 and the spacer oxide on the sidewall. This allows the cell poly to overlap the access device poly and thus insure complete coverage of all remaining active area in the cell region. This maximizes cell capacitance since no active area is wasted having to allow for a misalignment tolerance between Poly 2 and the active regions of the access device.

(5) In any general process flow, isolation field oxide thinning is encountered in processing between the Poly 1 and Poly 2 levels. This results in reduced parasitic field device threshold and thus compromises the integrity of the electrical isolation. This can be a problem for the conventional (prior art) process flow where the transistor poly (Poly 2) sees the thinnest field oxide. With common bootstrapping and double bootstrapping circuit techniques used on NMOS DRAM's, voltages of 12-15 volts at Vcc=6V are possible on some transistor poly gate circuit nodes. This can compromise high poly VCC margin. For the present invention, the transistor gate poly is formed from Poly 1. Minimal field oxide thinning is seen prior to Poly 1 deposition thus insuring an adequate field oxide thickness for transistor poly nodes. The normal thinning of field oxide seen prior to Poly 2 is not detrimental on the reverse poly DRAM process since Poly 2 is used only for the cell plate for the capacitor which is biased at DC ground.

(6) The high current/high dose Arsenic S/D implant is done prior to cell capacitor formation. This spares the cell cap of having to withstand the electric field stress present due to charging effects associated with the S/D implant. This is a major factor as cell dielectrics continue to thin and become more and more sensitive to E-fields present during processing.

(7) Transistor formation on the reverse poly DRAM process utilizes a unique technique for lightly doped drain (LDD) formation. The LDD regions are defined using an oxide spacer. This approach makes possible a dramatic reduction in device length without incurring the detrimental "short channel" effects seen with conventional approaches. Also, high electric field hot electron and hot hole effects are greatly reduced. This makes for more stable device characteristics over time and thus greatly improves device reliability. Thickness of the spacer is easily changed allowing greater flexibility for device re-optimization when shrinking.

(8) The reverse poly DRAM process flow is highly compatible with next generation CMOS high density DRAM processes. This allows for ease in mutually running NMOS and CMOS steps together in the same fabrication area. Many of the furnace recipes, etch recipes, photo recipes, implants, and sputter recipes are identical allowing NMOS and CMOS to run side by side. More conventional NMOS DRAM processes do not offer this forward generation compatibility.

(9) Cell capacitance can be increased without adding masking steps using this reverse poly DRAM process sequence. The cell capacitor dielectric is formed after the transistors have been formed and encapsulated in oxide, top and side. Poly 2 is then deposited and etched. After the Poly 2 etch the dielectric is etched away from regions where the Poly 2 had been etched away. This self-aligns the cell dielectric underneath to the cell poly field plate.

The reverse poly DRAM process results in the manufacture of memory circuits in less photomasking steps than had previously been required. Additionally fewer levels require stringent alignment and critical dimension control. The remaining levels are non-critical and afford rapid throughput with less stringent specifications. No extra mask step for Vt adjust is required. This process requires only one high current implant saving machine cost and floor space.

DETAILED DESCRIPTION OF THE PREFERRED EMBODIMENTS

The invention uses various materials which are electrically either conductive, insulative or semiconductive, although the completed device is referred to as a semiconductor. One of the materials used is polysilicon material, referred to as "poly" throughout this disclosure.

Figure 1:
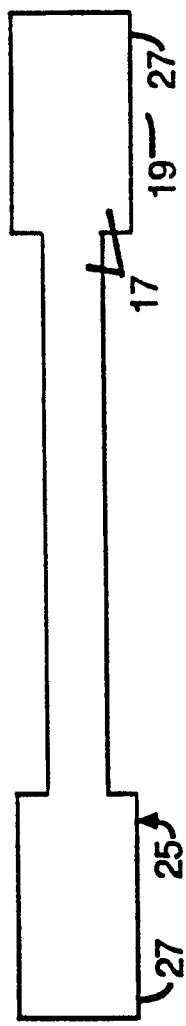
FIG. 1 shows a top view of Level 1 of the fabrication of a semiconductor.
Figure 2:
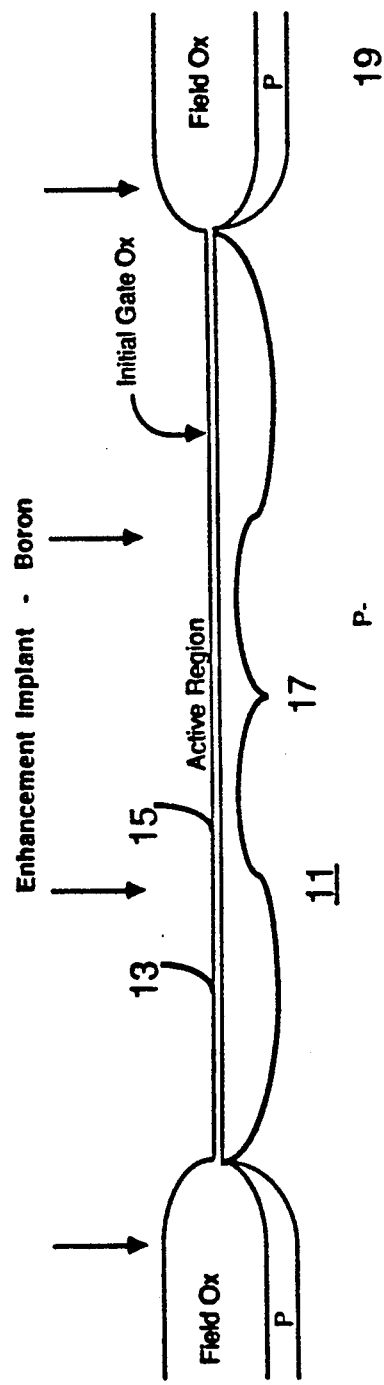
FIG. 2 shows a cross section of the semiconductor of FIG. 1.
Figure 3:
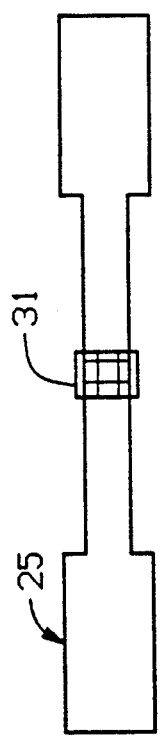
FIGS. 3-5 show Level 2, involving buried contact photomask patterning, buried contact oxide etch, photoresist removal, Poly 1 deposition and phosphorus doping.

Referring to FIGS. 1 and 2, beginning with a P-type starting wafer, LOCOS (local oxidation of silicon) techniques are used to define active 17 and isolation 19 regions of a substrate 11.

The active regions 19 are located where preferably all active devices are found on the semiconductor. The LOCOS initial oxidation 15 also used as the gate oxide in active regions 17.

The LOCOS forms a pattern on the top surface 13 such that a series of "dogbone" shapes 25 are formed in an interlocking pattern on the surface of the wafer 11. In the preferred embodiment, a silicon wafer is divided a plurality of dice, each of which die have 128K (131,072) of these "dogbone" shapes 25 formed thereon. Each end 27 of the "dogbones" 25 will become a storage area or capacitor for the semiconductor which, in the preferred embodiment is a DRAM. Therefore, each "dogbone" 25 can store two bits of information.

Figure 5:
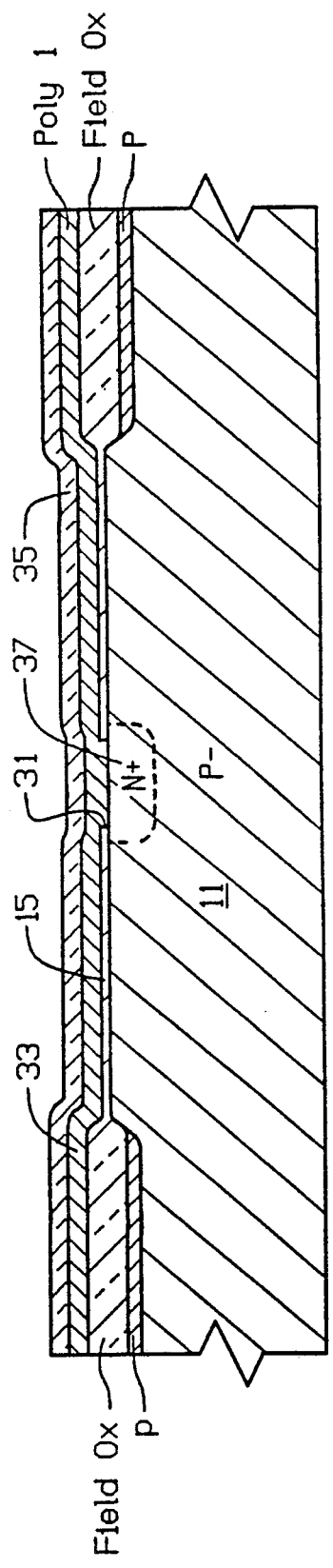

Referring to FIGS. 32, a hole 31 is cut in the initial oxide 15, at the middle of the "dogbone" shape 25. A photopattern is used in order to accomplish this cutting of the hole 31, and the cutting of hole 31 is accomplished by an oxide etch. The photopattern uses a photoresist material, which is removed and a first polysilicon deposition 33 is applied which is the Poly 1 deposition. The Poly 1 33 will become the transistor gate structure as shown in FIGS. 5 and 6.

The Poly 1 is then treated by coating a PH3 glaze 35 by using thermal deposition techniques. This is accomplished at a temperature which is approximately 900 (celcius), with the preferred range of temperatures being between 905° and 909°, or more generally, between 800° and 1000°. Other deposition techniques could be used, which may operate at ranges from room temperature to 1200°.

At these temperatures, the phosphorus readily diffuses through the silicon 33, but does not readily diffuse through the oxide 15. This diffusion of phosphorus to the polysilicon forms a buried contact 37 of n-type material through its diffusion into the substrate silicon. As indicated, the phosphorus does not diffuse through the inner oxide, and therefore is generally limited to the area of the etched hole 31.

Figure 6:
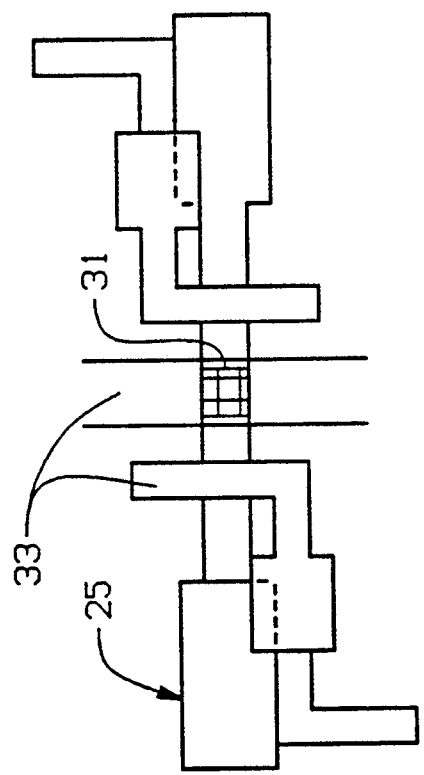
FIGS. 6-8 show Level 3, involving interpoly layer oxide deposition, access transistor and spherical transistor photo patterning.
Figure 7:
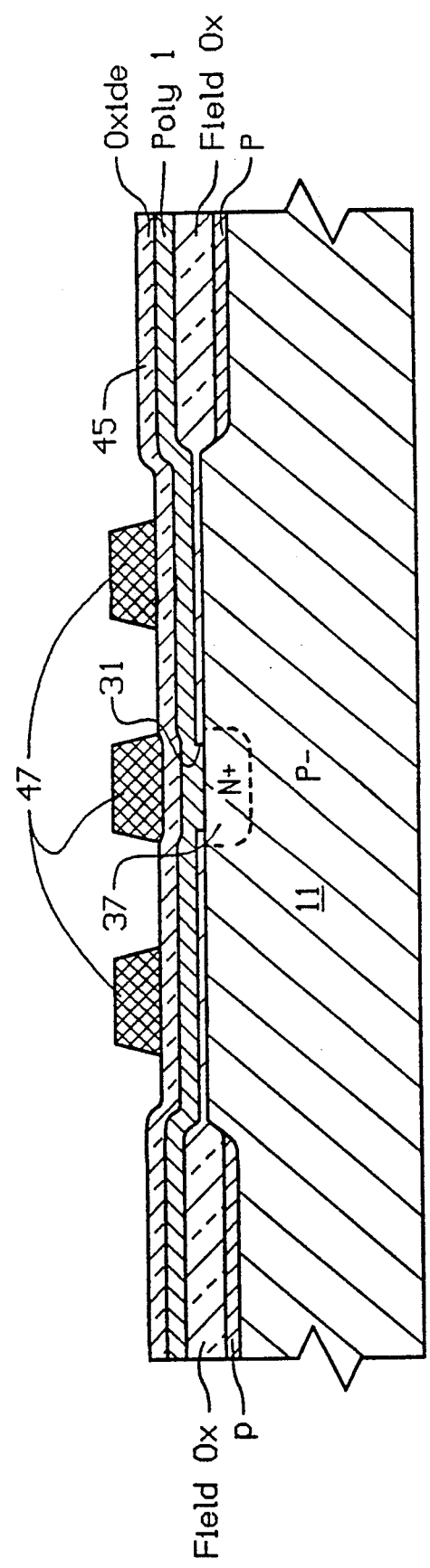
Figure 8:
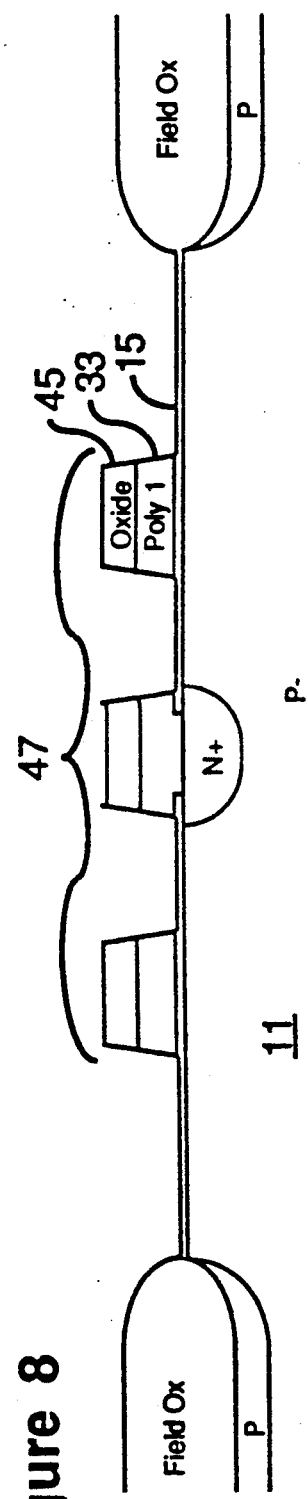

Referring to FIGS. 6-8, the glaze oxide 35 is stripped off and a silicon dioxide layer is deposited (not shown) A photomask is superimposed over the silicon dioxide 45 in a desired pattern 47.

The pattern corresponds to that of transistor gates, access device gates, bit lines and peripheral interconnect lines. In the region where the Poly 1. 33 fills the hole 31 in the initial oxide, the phosphorus doped substrate 37 forms a buried contact with the Poly 1 digit line.

Referring to FIG. 8, at this point, the silicon dioxide is etched in accordance with the pattern 47, along with Poly 1 33 and a silicon dioxide 45. The photoresist is stripped and the resulting pattern consists of the silicon dioxide 45, Poly 1 33 and initial oxide 15.

Figure 9:
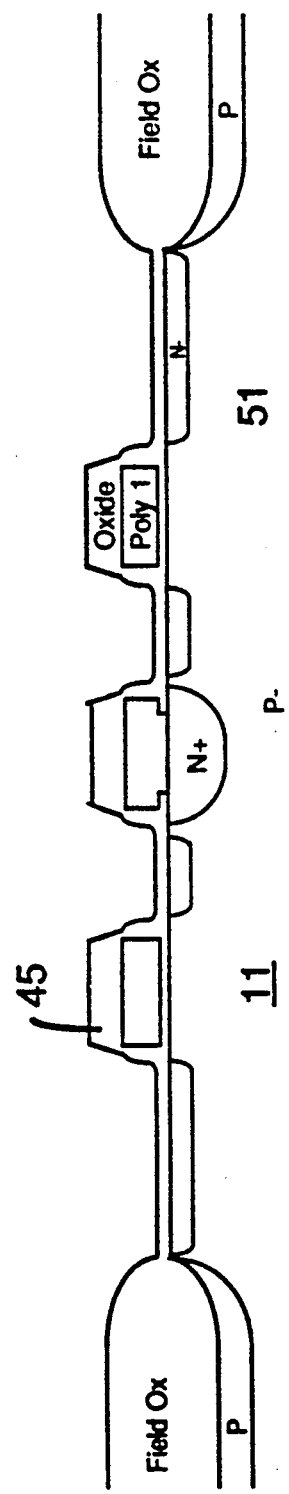
FIGS. 9-11 show oxide and poly stack anisotropic dry etch, resist removal, LDD transistor implants and drive.

At that point, a dopant implant is used, in which a lightly doped drain (LDD) 51 is formed, as shown in FIG. 9.

Figure 4:
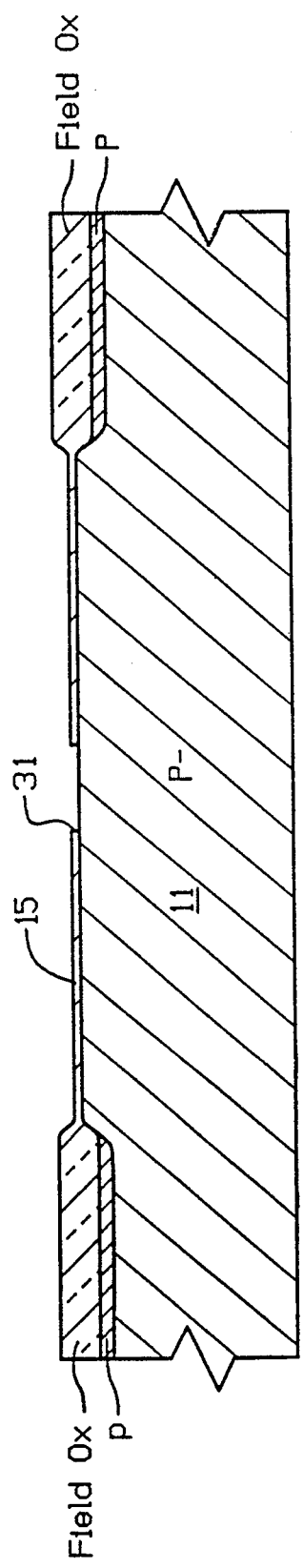
Figure 10:
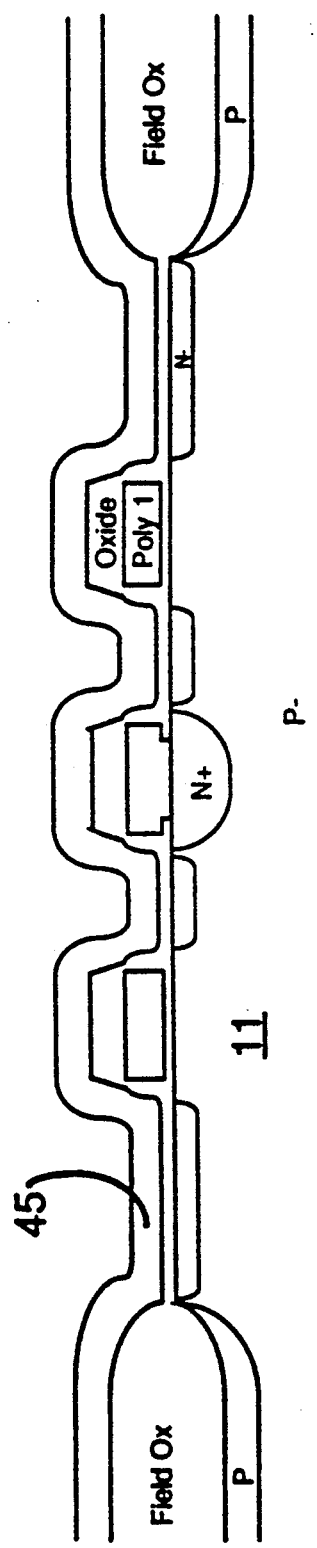
Figure 11:
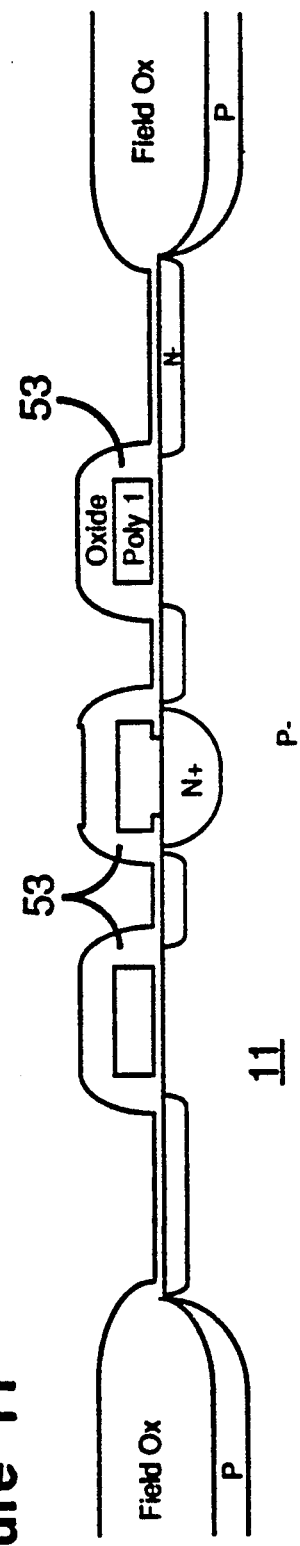

Referring to FIGS. 10-11, a coating of oxide is applied and is anisotropically etched to a depth which vertically slightly exceeds that of the thickness of the newly-applied oxide. This results in spacers of oxide remaining on the sidewalls of the Poly 1 pattern 47, indicated at 53. Since the anisotropic etch is vertical, the side walls, which have been bare of oxide prior to the deposition of the oxide remain covered, whereas the tops of the pattern 47 remain covered as a result of oxide 45 (FIG. 4) having been present prior to the last deposition of oxide. Therefore, the additional oxide on the horizontal surfaces is mostly sacrificial, since a vertical etch is applied to the oxide. This results in a Poly 1 being encapsulated by oxide on top and both sides, as shown in FIG. 11.

Figure 12:
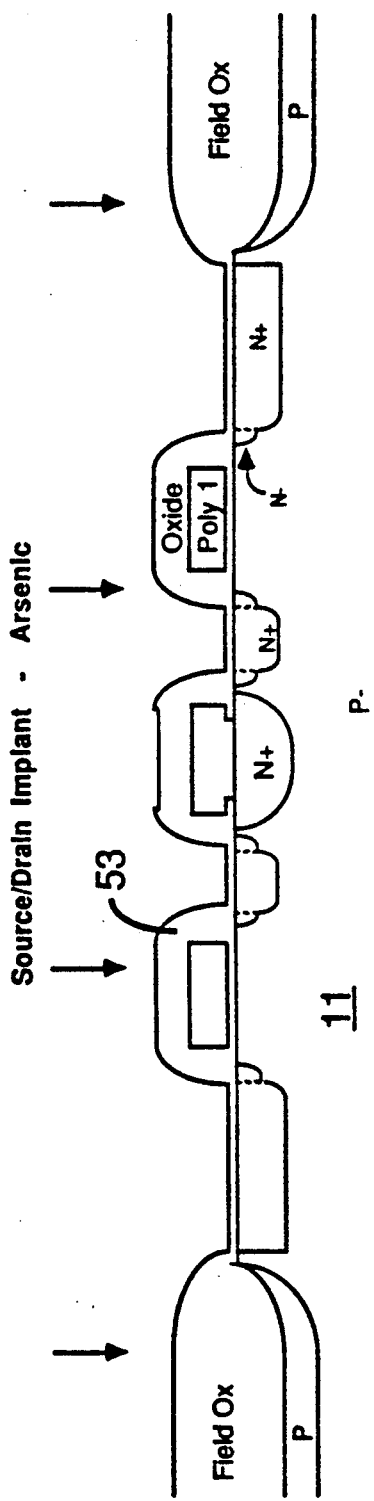
FIG. 12 shows spacer oxide deposition and spacer anisotropic dry etch.

As shown in FIG. 12, arsenic is used to dope the non-oxided areas, forming a source drain and therefore forming N-type regions of dopant. The arsenic doping is very much heavier than the earlier phosphorus doping and is therefore able to dominate at locations where the arsenic doping is applied. Arsenic doping also results in the formation of bottom plates of storage capacitors, which are N-type regions of arsenic doping. The N-type regions are therefore diode-isolated from substrate 11, which, as mentioned earlier, is a P-type material.

Figure 13:
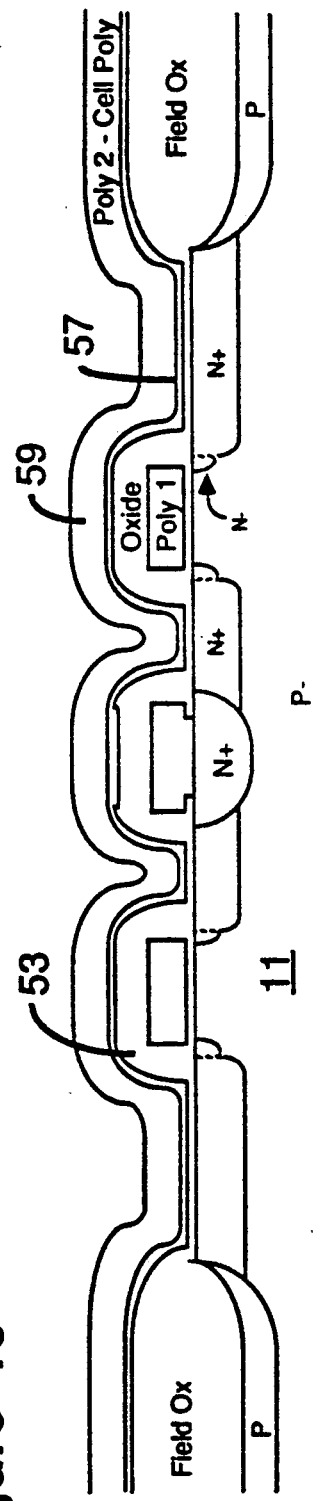
FIG. 13 shows cell capacitor dielectric formation.
Figure 14:
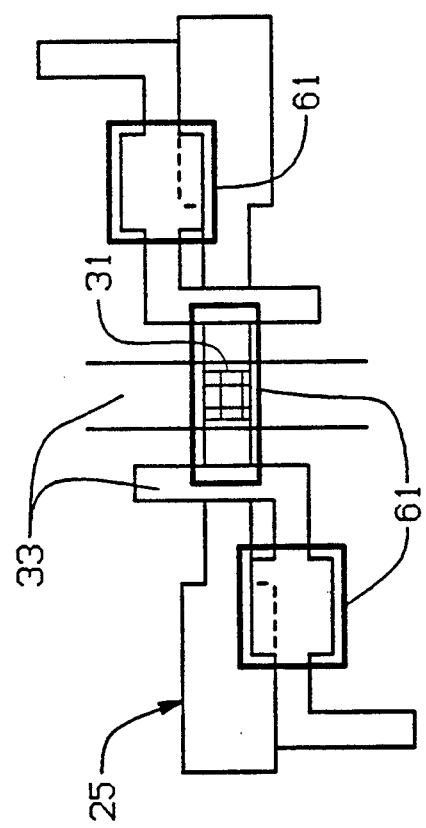
FIGS. 14 and 15 show Level 4, involving cell plate photo patterning.
Figure 15:
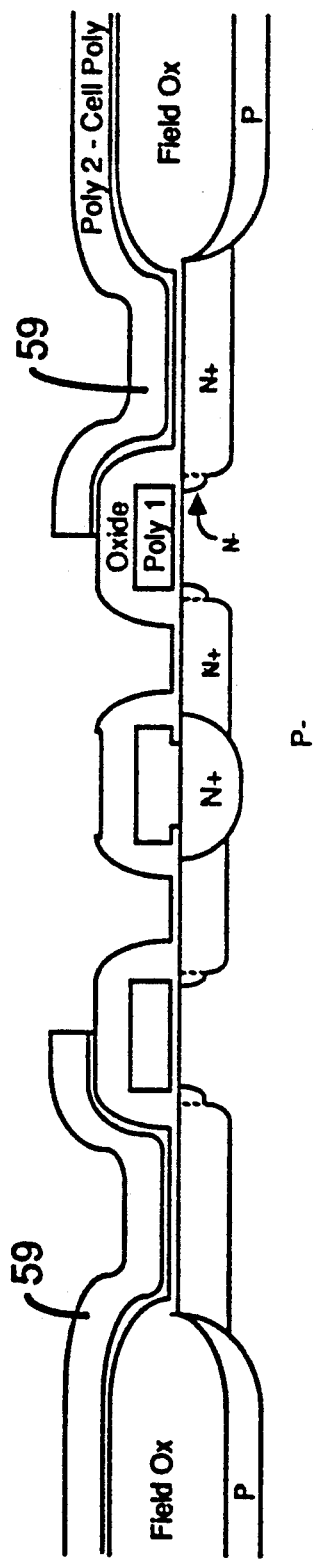

Referring to FIG. 13, a dielectric is formed over the previous layers. Referring to FIGS. 14-15, the Poly 2 59 and dielectric material 57 are isotropically etched with a fourth mask (level 4 mask). This forms a cell plate in desired regions and etches the dielectric and Poly 2 59 from undesired regions 61.

This leaves the cell poly 59 (Poly 2) only in capacitor regions.

Figure 16:
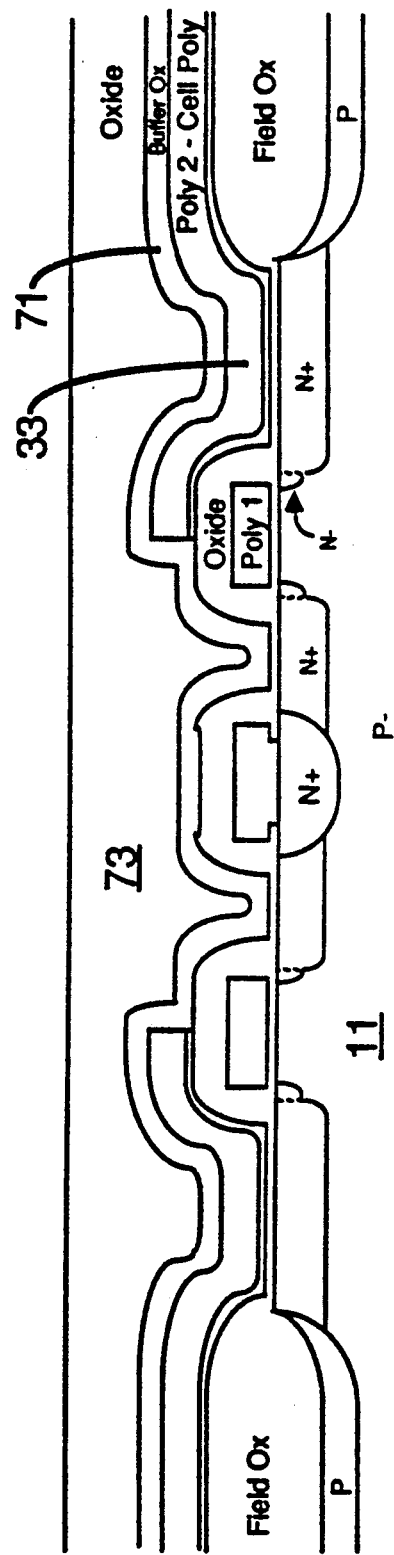
FIG. 16 shows Levels 5, 6 and 7, which include conventional contact, metal, and bond pad formation.

In FIG. 16, a buffer oxide 71 is applied and then another oxide 73 is applied. A reflow process is used to smooth or planarize the surface.

Figure 17:
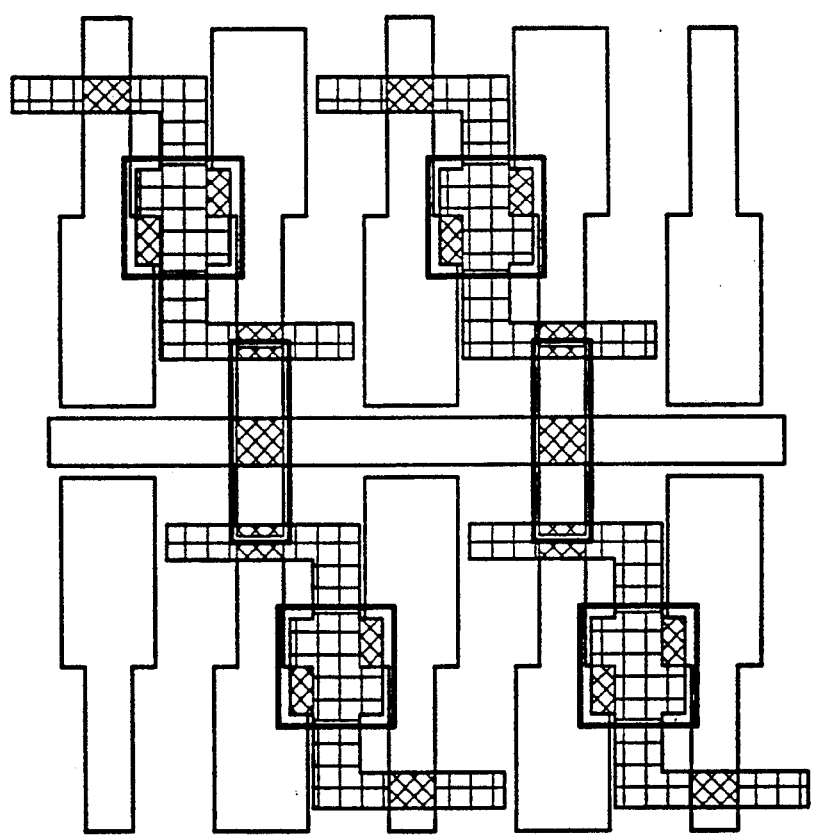
FIG. 17 shows the pattern of the semiconductor DRAM memory device constructed in accordance with the invention.

At that time, a contact pattern consisting of contacts (not shown) are applied and metal depositioning and patterning is applied in a metalization step. This results in the pattern shown in FIG. 17. A passivation layer is then applied and is patterned in order to protect the exposed surface of the semiconductor.

What has been described are very specific steps used in constructing the preferred embodiment of the invention. The process described includes seven photomasking steps:

1—active area

2—buried contacts
3—Poly 1
4—Poly 2
5—metal contacts
6—metal
7—bonding pads

Clearly, other steps may be taken within the scope of the invention in order to accomplish either same or different circuit results. Accordingly, the invention should be read only as limited by the claims.

We claim:

1. DRAM semiconductor memory device, in which a semiconductive material wafer having a top surface is used as a substrate and the top surface is enhanced by deposition, etching and doping, the device comprising:
   a substrate;
   an oxide layer on the substrate defining active and isolation regions of the top surface, the isolation layers exhibiting an increase in thickness of the oxide layer over the active regions;
   the active regions forming a "dogbone" pattern, wherein each active region exhibits an elongate shape, with each end of the elongate shape being wider than a center leg of the elongate shape, the active regions being arrayed in alternating sequence such that the ends of alternating columns of the active regions nests with the center legs of alternate columns of the active regions;
   a first series of polysilicon overlays having center portions which overlap nested active regions at intersections of the center legs and the ends, and having extensions, each extending first parallel to the elongate shapes and then perpendicularly across an elongate shape at the center section, the first series of polysilicon overlays being etched in a pattern of transistor gates, thereby defining a series of transistors;
   a second series of polysilicon overlay forming a pattern of straight lines which alternately intersects the active regions across the center legs at the center of the center legs and passes between pairs of the ends; and
   each further polysilicon overlay having a contact pad on its center portion.

2. Memory device as described in claim 1, further comprising:
   a buried contact in the substrate below said locations defined by the intersection of the second series of polysilicon overlays and the center legs.

3. Memory device as described in claim 2, further comprising
   (a) the substrate being doped at said buried contact; and
   (b) said doping of the substrate having been accomplished subsequent to said etching in the pattern of buried contacts.

4. DRAM semiconductor memory device, in which a semiconductive material wafer having a top surface is used as a substrate and the top surface is enhanced by deposition, etching and doping, wherein transistor gates are formed from a first layer of semiconductive material, a dielectric is formed over the first layer of semiconductive material and capacitor plates are formed from a second layer of semiconductive material, comprising the configuration of FIG. 17, wherein the shaded areas which have horizontal and vertical hatch marks represent active areas of the wafer, and the shaded areas which have diagonal hatch marks represent semiconductive material which is superimposed on the semiconductive material wafer.

* * * * *